(12) United States Patent
Zhou et al.

(10) Patent No.: US 9,749,567 B2
(45) Date of Patent: Aug. 29, 2017

(54) OPERATING METHOD OF IMAGE SENSOR

(71) Applicant: UNITED MICROELECTRONICS CORP., Hsin-Chu (TW)

(72) Inventors: Zhibiao Zhou, Singapore (SG); Chen-Bin Lin, Taipei (TW); Ding-Lung Chen, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/953,411

(22) Filed: Nov. 29, 2015

(65) Prior Publication Data

US 2017/0155861 A1   Jun. 1, 2017

(51) Int. Cl.
*H04N 5/374* (2011.01)
*H01L 31/0352* (2006.01)
*H01L 27/146* (2006.01)
*H04N 9/04* (2006.01)

(52) U.S. Cl.
CPC ....... *H04N 5/374* (2013.01); *H01L 27/14667* (2013.01); *H01L 31/035218* (2013.01); *H04N 9/04* (2013.01)

(58) Field of Classification Search
CPC ............................ H04N 5/374–5/37457; H01L 27/14692–27/14696; H01L 31/035218; H01L 27/14667
See application file for complete search history.

(56) References Cited

U.S. PATENT DOCUMENTS

| 8,530,993 B2 | 9/2013 | Tian |
| 8,537,245 B2 | 9/2013 | Jovanovski |
| 8,779,432 B2 | 7/2014 | Yamazaki |
| 8,780,614 B2 | 7/2014 | Takemura |
| 9,042,161 B2 | 5/2015 | Koyama |
| 9,054,200 B2 | 6/2015 | Okazaki |

(Continued)

FOREIGN PATENT DOCUMENTS

WO    2013183426    12/2013

OTHER PUBLICATIONS

Kurokawa et al., "High-Sensitivity Image Sensor with Stacked Structure comprising Crystalline Selenium Photoconductor, Crystalline OS FET, and CMOS FET", Session 11, 2015 International Image Sensor Workshop, Jun. 10, 2015.

(Continued)

*Primary Examiner* — Paul Berardesca
(74) *Attorney, Agent, or Firm* — Winston Hsu

(57) ABSTRACT

An operating method of an image sensor includes the following steps. The image sensor includes at least one pixel unit. The pixel unit includes a photoelectric conversion unit, a first control unit, a capacitor unit, and a sensing unit. The photoelectric conversion unit includes a quantum film photoelectric conversion unit, and the first control unit includes an oxide semiconductor transistor. The capacitor unit is coupled to the first control unit, and the sensing unit is configured to sense signals at a sense point coupled between the first control unit and the sensing unit. The pixel unit is discharged before a readout operation. The capacitor unit is charged by electrons emitted from the photoelectric conversion unit when the photoelectric conversion unit is excited by light. Signals at the sense point are then sensed by the sensing unit.

12 Claims, 5 Drawing Sheets

(56) References Cited

U.S. PATENT DOCUMENTS

| | | |
|---|---|---|
| 9,081,049 B2 | 7/2015 | Ainspan |
| 2010/0090195 A1 | 4/2010 | Parsapour |
| 2015/0189200 A1 | 7/2015 | Jin |
| 2016/0035920 A1* | 2/2016 | Tashiro ................ H04N 5/3575 250/208.1 |
| 2016/0316159 A1* | 10/2016 | Yoneda ................ H04N 5/3698 |

OTHER PUBLICATIONS

Fossum, "Quanta Image Sensor: Possible paradigm shift for the future", Grand Keynote, IntertechPira Image Sensors 2012, London, England, UK, Mar. 22, 2012.

\* cited by examiner

US 9,749,567 B2

OPERATING METHOD OF IMAGE SENSOR

BACKGROUND OF THE INVENTION

1. Field of the Invention

The present invention relates to an operating method of an image sensor, and more particularly, to an operating method of an image sensor including a quantum film photoelectric conversion unit and an oxide semiconductor transistor.

2. Description of the Prior Art

CMOS image sensors (hereinafter abbreviated as CIS) are widely used in various applications such as digital cameras, camcorders, personal communications systems, medical micro camera, robots, etc. The CIS are used to sense a volume of exposed light projected towards a semiconductor substrate. To do this, the CIS use an array of pixels, or image sensor elements, to collect photo energy and convert images into electrical signals that can be used in a suitable application. A CIS pixel includes a photodetector such as a photodiode, photogate detector, or phototransistor, to collect photo energy. Under the limited size of the CIS, each of the pixels becomes smaller for the demands for higher resolution, and the sensitivity of each pixel becomes lowered accordingly. Therefore, higher sensitivity and higher resolution have been the main performance indexes to be continuously improved in the related industries. Additionally, the CIS also confront further demands for low power consumption, low noise, and new applications such as motion detection.

SUMMARY OF THE INVENTION

It is one of the objectives of the present invention to provide an operating method of an image sensor. The image sensor includes a quantum film photoelectric conversion unit and a control unit including an oxide semiconductor transistor. The quantum film photoelectric conversion unit is used to improve the sensitivity or the resolution of the image sensor. The oxide semiconductor transistor is used to hold data with extremely low leakage current. In the operating method, a capacitor unit is charged by electrons emitted from the photoelectric conversion unit when the photoelectric conversion unit is excited by light, and signals at a sense point may then be sensed by the sensing unit. Longer data retention performance may be achieved in the pixel unit, the related readout and signal process circuits may be simplified, and other functions such as motion detection may also be realized accordingly.

An operating method of an image sensor is provided in an embodiment of the present invention. The operating method includes the following steps. An image sensor is provided. The image sensor includes at least one pixel unit, and the pixel unit includes a photoelectric conversion unit, a first control unit, a capacitor unit, and a sensing unit. The photoelectric conversion unit includes a quantum film photoelectric conversion unit, and the first control unit includes an oxide semiconductor transistor. The capacitor unit is coupled to the first control unit. The sensing unit is configured to sense signals at a sense point coupled between the first control unit and the sensing unit. The pixel unit is discharged by the first control unit before a readout operation. The capacitor unit is charged by electrons emitted from the photoelectric conversion unit when the photoelectric conversion unit is excited by light. The signals at the sense point are then sensed by the sensing unit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
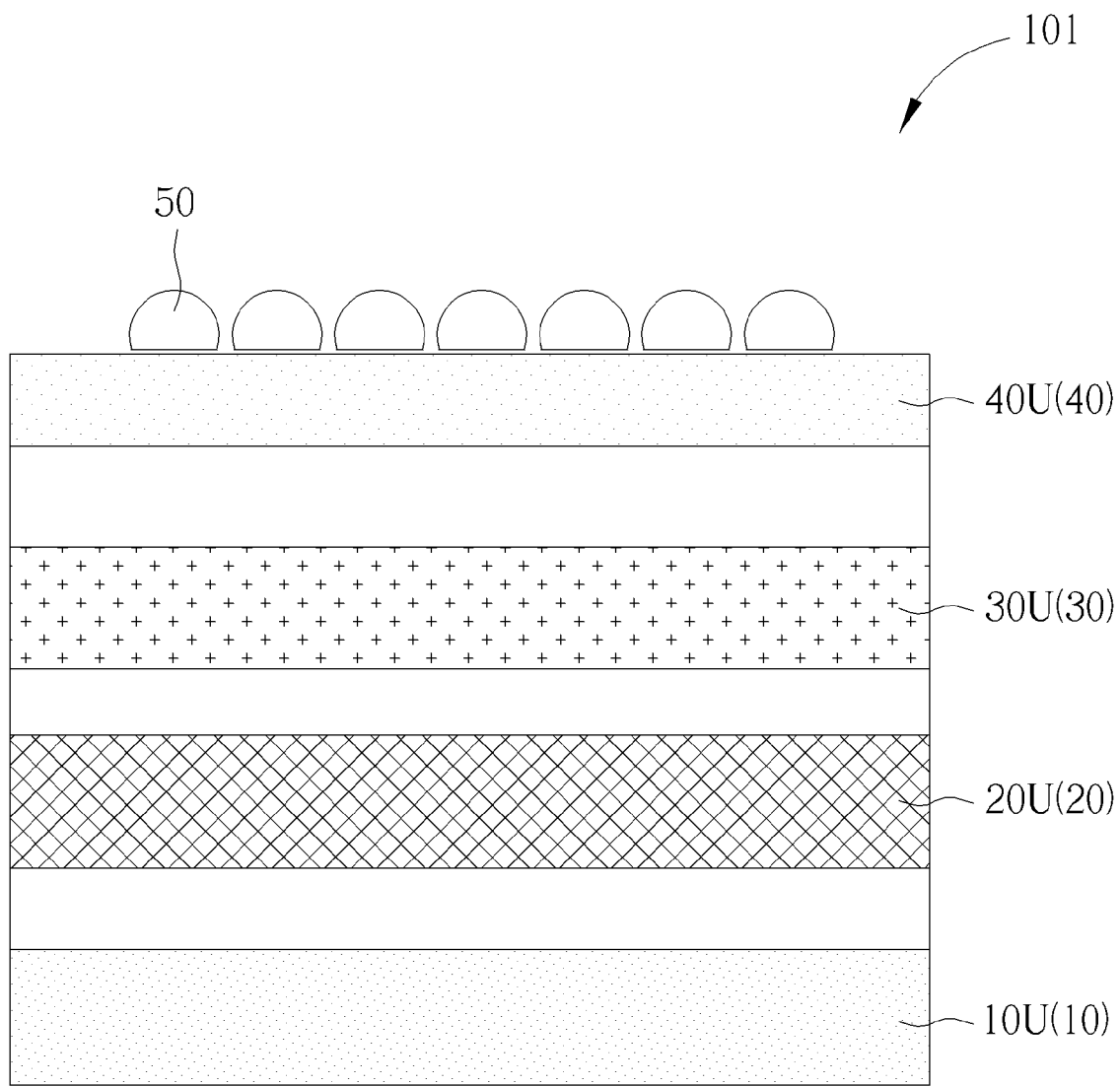
FIG. 1 is a schematic drawing illustrating an image sensor according to a first embodiment of the present invention.
Figure 2:
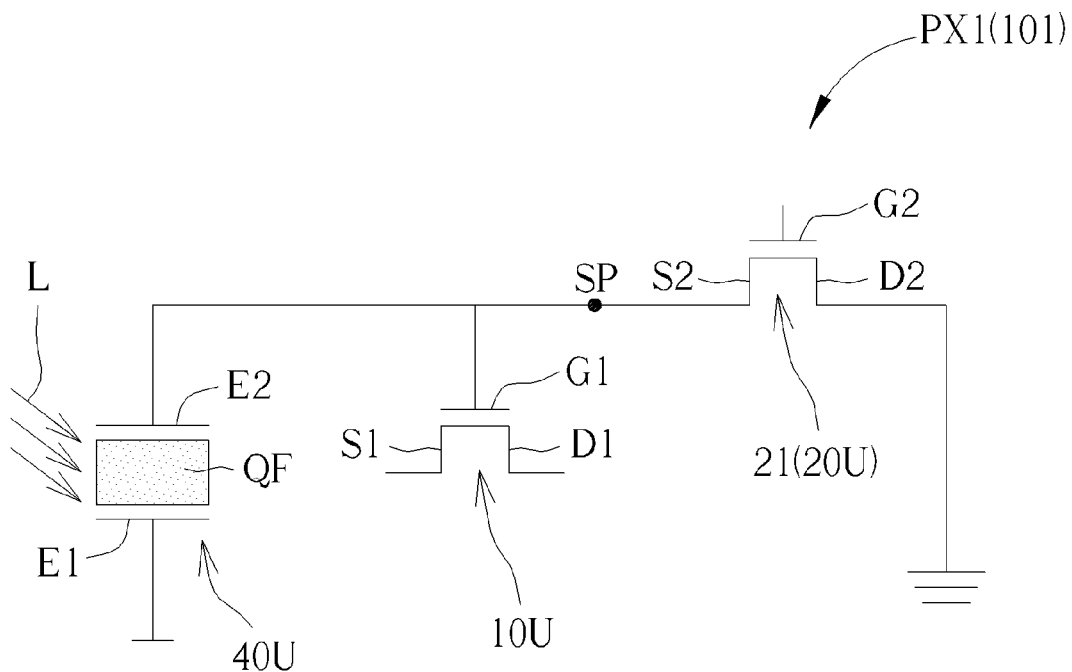
FIG. 2 is a schematic drawing illustrating a pixel unit according to the first embodiment of the present invention.
Figure 3:
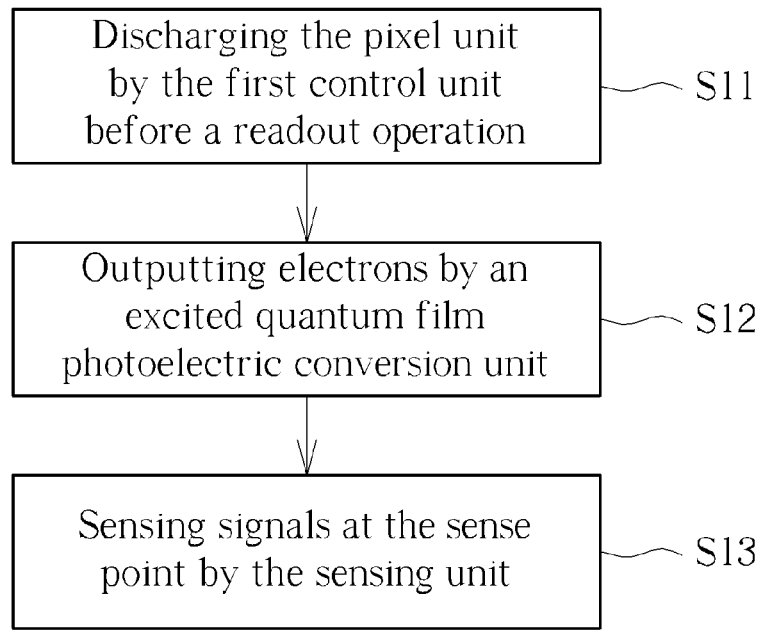
FIG. 3 is a flowchart of an operating method of the image sensor according to the first embodiment of the present invention.

Please refer to FIGS. 1-3. FIG. 1 is a schematic drawing illustrating an image sensor according to a first embodiment of the present invention. FIG. 2 is a schematic drawing illustrating a pixel unit of the image sensor in this embodiment. FIG. 3 is a flow chart of an operating method of the image sensor in this embodiment. As shown in FIG. 1, an image sensor 101 is provided in this embodiment. The image sensor 101 includes a process structure 10, a control structure 20, and a photoelectric conversion structure 40. The photoelectric conversion structure 40 is used to collect charge generated after absorbing light irradiating the image sensor 101. The control structure 20 is configured to control the readout operation, and the process structure 10 is configured to process signals received from the photoelectric conversion structure 40. In this embodiment, the photoelectric conversion structure 40 may include a quantum film photoelectric conversion structure using quantum dot material for high efficient photoelectric conversion. The control structure 20 may include an oxide semiconductor structure having low leakage current for long data retention and low power consumption.

As shown in FIG. 1 and FIG. 2, the control structure 20 may include at least one control unit 20U, and the control unit 20U may be an oxide semiconductor transistor. The process structure 10 may include at least one sensing unit 10U, and the sensing unit 10U may include an oxide semiconductor transistor and/or a silicon semiconductor transistor (such as a MOSFET), but not limited thereto. The process structure 10 may include other required unit such as an analog-to-digital converter (ADC), but not limited thereto. The photoelectric conversion structure 40 may include at least one photoelectric conversion unit 40U, and the photoelectric conversion unit 40U may include a quantum film photoelectric conversion unit composed of a quantum film QF sandwiched by a common electrode E1 and a pixel electrode E2, but not limited thereto. The image sensor 101 in this embodiment may include at least one pixel unit PX1 comprising the photoelectric conversion unit 40U, the control unit 20U (such as a first control unit 21 shown in FIG. 2), and the sensing unit 10U. In other embodiments of the present invention, the image sensor may include a plurality of the pixel units PX1 arranged in an array configuration, but not limited thereto.

In this embodiment, the oxide semiconductor transistor mentioned above may include an indium gallium zinc oxide (IGZO) transistor or a transistor composed of other suitable oxide semiconductor material. For example, the oxide semiconductor material may include a group II-VI compound (such as zinc oxide, ZnO), a group II-VI compound doped with alkali earth metal (such as magnesium zinc oxide, ZnMgO), a group II-VI compound doped with group IIIA element (such as indium gallium zinc oxide, IGZO), a group II-VI compound doped with group VA element (such as stannum stibium oxide, $SnSbO_2$), a group II-VI compound doped with group VIA element (such as zinc selenium oxide, ZnSeO), a group II-VI compound doped with transition metal (such as zinc zirconium oxide, ZnZrO), or other semiconductor oxide made by mixing the above-mentioned elements, but not limited thereto. The quantum film QF may include cadmium sulphide (CdS), cadmium selenide (CdSe), lead sulphide (PbS), lead selenide (PbSe), indium arsenide (InAs), indium phosphide (InP), or other suitable quantum dot materials.

As shown in FIG. 1 and FIG. 2, the image sensor 101 may further include a capacitor structure 30, and the capacitor structure 30 may include at least one capacitor unit 30U. The capacitor unit 30U may include a stacked metal-insulator-metal (MIM) structure or other suitable structures. The control structure 20 including the first control unit 21, the capacitor unit 30U, and the sensing unit 10U are disposed under the photoelectric conversion unit 40U preferably, but not limited thereto. In addition, the process structure 10 may be formed in a semiconductor substrate (not shown), and the capacitor structure 30 and the control structure 20 including the oxide semiconductor transistor may be integrated in the back end of line (BEOL) process of the semiconductor substrate, but not limited thereto. The photoelectric conversion unit 40U, the capacitor unit 30U, the control unit 20U, and the sensing unit 10U may be integrated at different levels for saving the chip area, and one stop solution for the image sensor may be achieved accordingly. The process structure 10 may be electrically connected to the control structure 20, the capacitor structure 30, and/or the photoelectric conversion structure through connecting structures such as a trough silicon via (TSV, not shown), but not limited thereto. Additionally, the image sensor 101 may further include a micro lens structure 50 disposed on the photoelectric conversion unit 40U for further enhancing the conversion efficiency.

As shown in FIG. 2 and FIG. 3, an operating method of the image sensor 101 in this embodiment includes the following step. First of all, the image sensor 101 including the pixel unit PX1 described above is provided. The pixel unit PX1 includes the photoelectric conversion unit 40U, the first control unit 21, and the sensing unit 10U. The photoelectric conversion unit 40U is a quantum film photoelectric conversion unit, and the first control unit 21 is an oxide semiconductor transistor. The first control unit 21 is coupled to the photoelectric conversion unit 40U, and the sensing unit 10U is configured to sense signals at a sense point SP coupled between the first control unit 21 and the photoelectric conversion unit 40U. Specifically, the sensing unit 10U may include a transistor having a gate G1, a source S1, and a drain D1, and the first control unit 21 may include an oxide semiconductor transistor having a gate G2, a source S2, and a drain D2. The source S2 of the first control unit 21 is coupled to the pixel electrode E2 of the photoelectric conversion unit 40U, and the drain D2 of the first control unit 21 may be connected to ground. The sense point SP may be a floating diffusion region between the first control unit 21 and the photoelectric conversion unit 40U for receiving charge collected by the photoelectric conversion unit 40U. The gate G1 of the sensing unit 10U is coupled between the first control unit 21 and the photoelectric conversion unit 40U, and the gate G1 is coupled to the sense point SP. The drain D1 of the sensing unit 10U may be connected to ground or a power source, and the source S1 of the sensing unit 10U may be connected to a selection element (not shown) and/or an ADC circuit (not shown) for outputting signals, but not limited thereto.

In step S11, the pixel unit PX1 is discharged by the first control unit 21 before a readout operation. Specifically, the first control unit 21 may be driven by a discharge signal applied to the gate G2 of the first control unit 21 so as to reset the voltage of the sense point SP before another readout operation. Subsequently, in step S12, electrons are output from the photoelectric conversion unit 40U excited by light L, and the sense point SP may be charged while the first control unit 21 is closed. In step S13, signals (such as a voltage signal) at the sense point SP are then sensed by the sensing unit 10U.

In the image sensor of this embodiment, the first control unit 21 includes an oxide semiconductor transistor with low leakage current, the signals at the sense point SP may be hold for longer time, and the related readout and signal process circuits may be simplified accordingly. In addition, the quantum film photoelectric conversion unit may be used to enhance conversion efficiency, and the image sensor 101 in this embodiment may support high resolution and high sensitivity demands.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
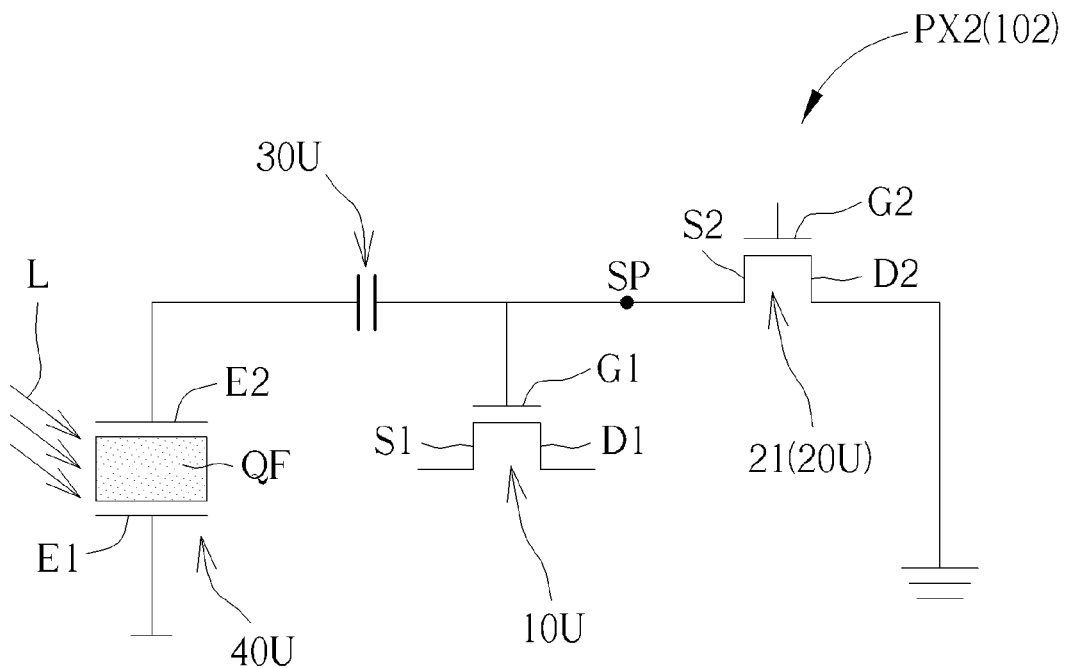
FIG. 4 is a schematic drawing illustrating an image sensor according to a second embodiment of the present invention.
Figure 5:
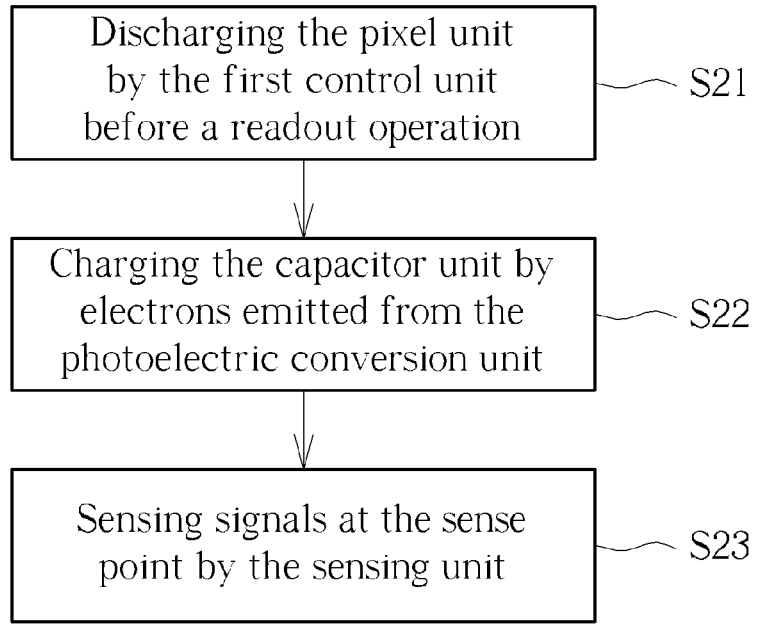
FIG. 5 is a flowchart of an operating method of the image sensor according to the second embodiment of the present invention.

Please refer to FIG. 4 and FIG. 5. FIG. 4 is a schematic drawing illustrating an image sensor 102 according to a second embodiment of the present invention, and FIG. 5 is a flow chart of an operating method of the image sensor 102 in this embodiment. As shown in FIG. 4, the differences between the image sensor 102 of this embodiment and the image sensor of the first embodiment mentioned above is that a pixel unit PX2 of the image sensor 102 may further include the capacitor unit 30U coupled to the first control unit 21. The sensing unit 10U is configured to sense signals at the sense point SP coupled between the first control unit 21 and the capacitor unit 30U in this embodiment. Specifically, one end of the capacitor unit 30U is coupled to the photoelectric conversion unit 40U, and the other end of the capacitor unit 30U is coupled to the source S2 of the first control unit 21. When the capacitor unit 30U is a stacked metal-insulator-metal (MIM) structure, the two ends of the capacitor unit 30U may be the opposite metals respectively, but not limited thereto. The gate G1 of the sensing unit 10U is coupled to the sense point SP, and the gate G1 of the sensing unit 10U is coupled between the capacitor unit 30U and the first control unit 21.

As shown in FIG. 4 and FIG. 5, an operating method of the image sensor 102 in this embodiment includes the following step. First of all, the image sensor 102 including the pixel unit PX2 described above is provided. In step S21, the pixel unit PX2 is discharged by the first control unit 21 before a readout operation. Specifically, the first control unit 21 may be driven by a discharge signal applied to the gate G2 of the first control unit 21 so as to reset the voltage of the sense point SP before another readout operation. Subsequently, in step S22, the capacitor unit 30U and the sense point SP are charged by electrons emitted from the photoelectric conversion unit 40U when the photoelectric conversion unit 40U is excited by light L and the first control unit 21 is turned off. In step S23, signals (such as a voltage signal) at the sense point SP are then sensed by the sensing unit 10U. The signals at the senses point SP may be enhanced by the capacitor unit 30U, and the first control unit 21 including the oxide semiconductor transistor coupled to the capacitor unit 30U may be used to hold signals for long data retention. For example, the signals at the sense point SP may be sensed after the shutter (not shown) of the image sensor 102 is closed, and the related readout and signal process circuits may be simplified accordingly.

Figure 6:
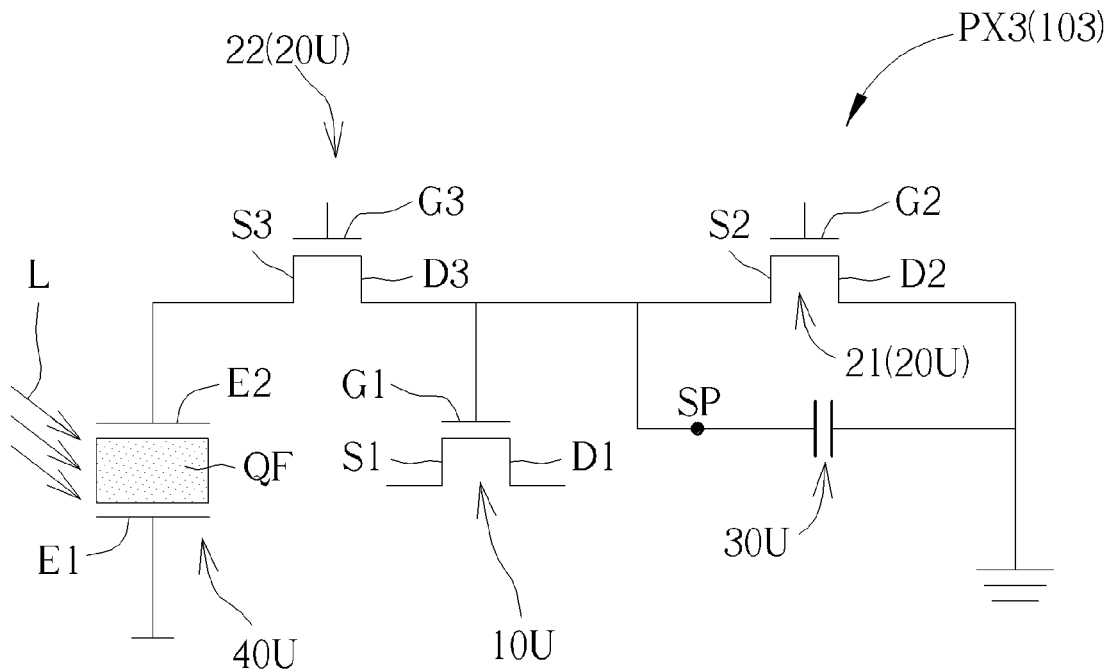
FIG. 6 is a schematic drawing illustrating an image sensor according to a third embodiment of the present invention.
Figure 7:
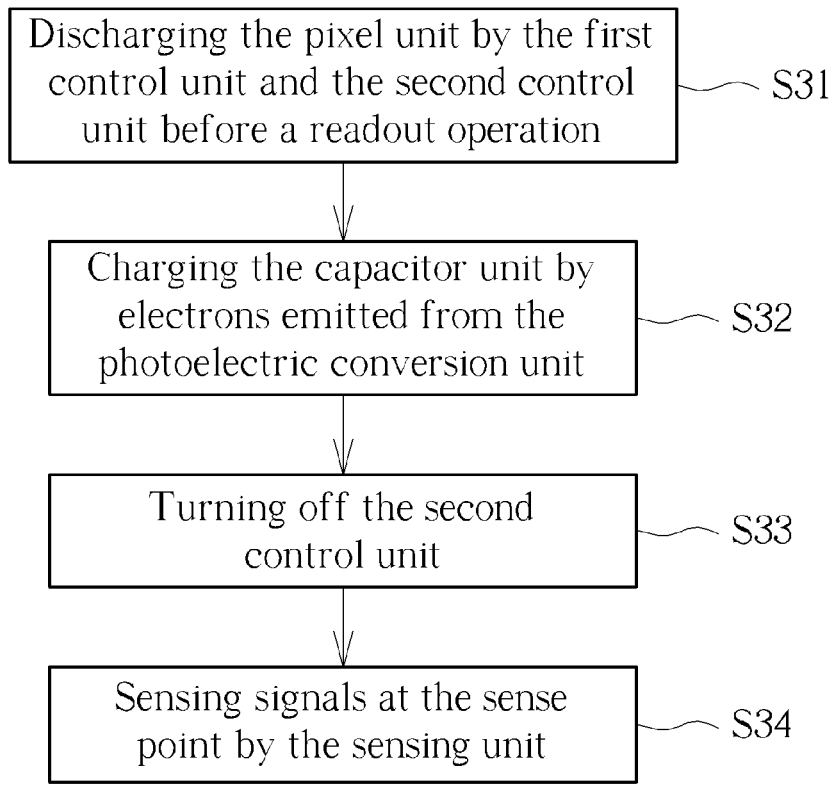
FIG. 7 is a flowchart of an operating method of the image sensor according to the third embodiment of the present invention.

Please refer to FIG. 6 and FIG. 7. FIG. 6 is a schematic drawing illustrating an image sensor 103 according to a third embodiment of the present invention, and FIG. 7 is a flow chart of an operating method of the image sensor 103 in this embodiment. As shown in FIG. 6, the differences between the image sensor 103 of this embodiment and the image sensor of the second embodiment mentioned above is that an pixel unit PX3 of the image sensor 103 further includes a second control unit 22 coupled between the photoelectric conversion unit 40U and the sensing unit 10U, and the second control unit 22 may include an oxide semiconductor transistor configured to control a charging condition of the capacitor unit 30U. Specifically, the second control unit 22 and the first control unit 21 may be included in the control structure mentioned above, and the second control unit 22 may be an oxide semiconductor having a gate G3, a source S3, and a drain D3. The source S3 of the second control unit 22 is connected to the pixel electrode E2 of the photoelectric conversion unit 40U, and the drain D3 of the second control unit 22 is connected to the source S2 of the first control unit S2 and the gate G1 of the sensing unit 10U. The second control unit 22 transfers charge from the photoelectric conversion unit 40U to the sense point SP and the capacitor unit 30U when the second control unit 22 is driven by a transfer signal applied to the gate G3 of the second control unit 22. In this embodiment, the gate G1 of the sensing unit 10U is coupled between the first control unit 21 and the second control unit 22. One end of the capacitor unit 30U is coupled between the first control unit 21 and the second control unit 22, and the other end of the capacitor unit 30U is connected to ground, but the present invention is not limited to this. In other embodiments of the present invention, the other end of the capacitor unit 30U may also be connected to a power source having a specific voltage.

As shown in FIG. 6 and FIG. 7, an operating method of the image sensor 103 in this embodiment includes the following step. First of all, the image sensor 103 including the pixel unit PX3 described above is provided. In step S31, the pixel unit PX3 is discharged by the first control unit 21 and the second control unit 22 before a readout operation. Specifically, the first control unit 21 and the second control unit may both be driven for resetting the voltage of the sense point SP and discharging the capacitor unit 30U before another readout operation. Subsequently, in step S32, the capacitor unit 30U and the sense point SP are charged by electrons emitted from the photoelectric conversion unit 40U when the photoelectric conversion unit 40U is excited by light L. The first control unit 21 is turned off, and the second control unit 22 is turned on during the step S32. In step S33, the second control unit 22 is then turned off after the capacitor unit 30U is charged by the electrons emitted from the photoelectric conversion unit 40U. In step S34, signals at the sense point SP are then sensed by the sensing unit 10U. The signals at the sense point SP are sensed after the second control unit 22 is turned off, and the variation of the signals at the sense point SP due to the variation of the light at different time points may be identified. Therefore, functions such as motion detection may be supported by the image sensor 103 in this embodiment. Additionally, the first control unit 21 and the second control unit 22 may be an oxide semiconductor transistor with low leakage current respectively, and the signals at the sense point SP may be hold for long data retention. The signals at the sense point SP may be sensed after the shutter of the image sensor 103 is closed and the second control unit 22 is turned off, and even low speed processor may be compatible with the pixel unit PX3. In addition, when the image sensor includes a plurality of the pixel units arranged in an array configuration, the discharge signal and the transfer signal mentioned above may be generated by a row decoder (not shown), but not limited thereto.

Figure 8:
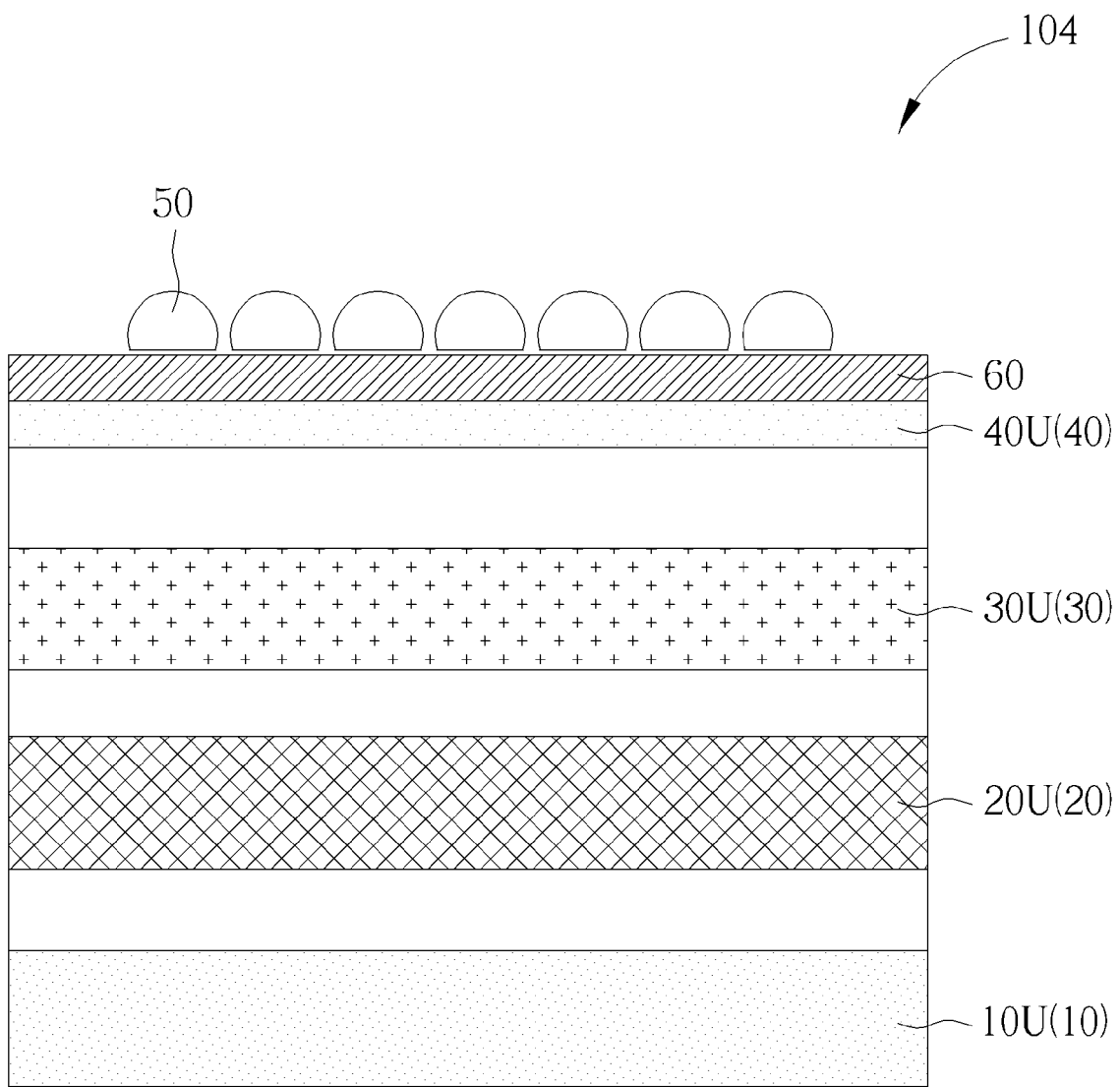
FIG. 8 is a schematic drawing illustrating an image sensor according to a fourth embodiment of the present invention.

Please refer to FIG. 8. FIG. 8 is a schematic drawing illustrating an image sensor 104 according to a fourth embodiment of the present invention. As shown in FIG. 6, the differences between the image sensor 104 of this embodiment and the image sensor of the first embodiment mentioned above is that the image sensor 104 may further include a color filter 60 disposed on the photoelectric conversion unit 40U. The color filter 60 is disposed between the micro lens structure 50 and the photoelectric conversion structure 40. The color filter 60 may include a plurality of color filter units (not shown) for filtering light within different wavelength ranges, and the image sensor 104 may capture color images accordingly. The color filter 60 in this embodiment may also be applied to other embodiments in the present invention, such as the second and the third embodiments described above.

To summarize the above descriptions, in the operating method of the image sensor in the present invention, the quantum film photoelectric conversion unit is used to improve the sensitivity or the resolution of the image sensor, and the oxide semiconductor transistor is used to hold data with extremely low leakage current. Longer data retention performance may be achieved in the pixel unit, the related readout and signal process circuits may be simplified, and other functions such as motion detection may also be realized accordingly. In addition, the photoelectric conversion unit, the capacitor unit, the control unit including the oxide semiconductor transistor, and the sensing unit may be integrated at different levels for saving the chip area, and one stop solution for the image sensor may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An operating method of an image sensor, comprising:
providing an image sensor, the image sensor comprising:
at least one pixel unit, the pixel unit comprising:

a photoelectric conversion unit, wherein the photoelectric conversion unit comprises a quantum film photoelectric conversion unit;
a first control unit, wherein the first control unit comprises an oxide semiconductor transistor, and a drain of the first control unit is connected to ground;
a capacitor unit coupled to the first control unit;
a sensing unit configured to sense signals at a sense point coupled between the first control unit and the capacitor unit; and
a second control unit coupled between the photoelectric conversion unit and the sensing unit, wherein the second control unit comprises an oxide semiconductor transistor configured to control a charging condition of the capacitor unit, and the sensing unit comprises a transistor having a gate directly connected with a drain of the oxide semiconductor transistor of the second control unit, wherein one end of the capacitor unit is coupled between the first control unit and the second control unit, and the other end of the capacitor unit is connected to the drain of the first control unit;
discharging the pixel unit by the first control unit before a readout operation;
charging the capacitor unit by electrons emitted from the photoelectric conversion unit when the photoelectric conversion unit is excited by light; and
sensing the signals at the sense point by the sensing unit.

2. The operating method of claim 1, further comprising:
discharging the pixel unit by the first control unit and the second control unit before the readout operation; and
turning off the second control unit after the capacitor unit is charged by the electrons emitted from the photoelectric conversion unit.

3. The operating method of claim 2, wherein the signals at the sense point are sensed after the second control unit is turned off.

4. The operating method of claim 1, wherein the gate of the sensing unit is coupled between the first control unit and the second control unit.

5. The operating method of claim 1, wherein the gate of the sensing unit is coupled to the sensing point.

6. The operating method of claim 5, wherein the gate of the sensing unit is coupled between the capacitor unit and the first control unit.

7. The operating method of claim 1, wherein the first control unit, the capacitor unit, and the sensing unit are disposed under the photoelectric conversion unit.

8. The operating method of claim 7, wherein the image sensor further comprises a micro lens structure disposed on the photoelectric conversion unit.

9. The operating method of claim 7, wherein the image sensor further comprises a color filter disposed on the photoelectric conversion unit.

10. The operating method of claim 1, wherein the sensing unit comprises a silicon semiconductor transistor or an oxide semiconductor transistor.

11. The operating method of claim 1, wherein the oxide semiconductor transistor of the first control unit and the oxide semiconductor transistor of the second control unit comprise indium gallium zinc oxide (IGZO) transistors.

12. An operating method of an image sensor, comprising:
providing an image sensor, the image sensor comprising:
at least one pixel unit, the pixel unit comprising:
a photoelectric conversion unit, wherein the photoelectric conversion unit comprises a quantum film photoelectric conversion unit;
a first control unit, wherein the first control unit comprises an oxide semiconductor transistor;
a capacitor unit coupled to the first control unit, wherein the capacitor unit is neither a transistor nor a part of a transistor; and
a sensing unit configured to sense signals at a sense point coupled between the first control unit and the capacitor unit, wherein one end of the capacitor unit is directly connected with and coupled to the photoelectric conversion unit, and the other end of the capacitor unit is coupled to the first control unit;
discharging the pixel unit by the first control unit before a readout operation;
charging the capacitor unit by electrons emitted from the photoelectric conversion unit when the photoelectric conversion unit is excited by light; and
sensing the signals at the sense point by the sensing unit.

* * * * *